United States Patent [19]
Sasaki et al.

[11] Patent Number: 6,060,971
[45] Date of Patent: May 9, 2000

[54] SUPERCONDUCTING MAGNET DEVICE FOR CRYSTAL PULLING DEVICE

[75] Inventors: Takashi Sasaki; Masanori Arata, both of Yokohama, Japan

[73] Assignee: Kabushiki Kaisha Toshiba, Kawasaki, Japan

[21] Appl. No.: 09/250,728

[22] Filed: Feb. 16, 1999

[30] Foreign Application Priority Data

Feb. 17, 1998 [JP] Japan .................................. 10-034911

[51] Int. Cl.⁷ ...................................................... H01F 7/00
[52] U.S. Cl. ........................... 335/301; 335/216; 324/318; 324/319; 117/32; 117/917
[58] Field of Search ........................... 335/216, 296–301; 324/318, 319, 320; 117/13, 30, 32, 917

[56] References Cited

U.S. PATENT DOCUMENTS

| | | |
|---|---|---|
| 4,590,428 | 5/1986 | Müller et al. . |
| 4,868,707 | 9/1989 | Takechi ..................................... 361/141 |
| 5,136,273 | 8/1992 | Ohta ......................................... 335/301 |
| 5,448,214 | 9/1995 | Laskaris ................................... 335/301 |

FOREIGN PATENT DOCUMENTS

| | | |
|---|---|---|
| 0 276 123 | 7/1988 | European Pat. Off. . |
| 63-204603 | 8/1988 | Japan . |
| 2 144 338 | 3/1985 | United Kingdom . |

OTHER PUBLICATIONS

Yasuto Miyazawa, et al., Journal of Crystal Growth, vol. 166, No. 1/04, pp. 286–290, "Flow in Oxide Melts in a High Magnetic Field", Sep. 1, 1996.

Patent Abstracts of Japan, vol. 13, No. 221 (C–598), May 23, 1989, JP 1–033093, Feb. 2, 1989.

Patent Abstracts of Japan, vol. 9, No. 184 (C–294), Jul. 30, 1985, JP 60–051691, Mar. 23, 1985.

Patent Abstracts of Japan, vol. 98, No. 2, Jan. 30, 1998, JP 9–271469, Oct. 21, 1997.

Patent Abstracts of Japan, vol. 97, No. 4, Apr. 30, 1997, JP 8–333190, Dec. 17, 1996.

Patent Abstracts of Japan, vol. 9, No. 059 (C–270), Mar. 15, 1985, JP 59–195595, Nov. 6, 1984.

Patent Abstracts of Japan, vol. 98, No. 2, Jan. 30, 1998, JP 9–262223, Oct. 7, 1997.

Patent Abstracts of Japan, vol. 17, No. 415 (E–1407), Aug. 3, 1993, JP 5–082338, Apr. 2, 1993.

Patent Abstracts of Japan, vol. 11, No. 83 (E–489), Mar. 13, 1987, JP 61–239605, Oct. 24, 1986.

*Primary Examiner*—Michael L. Gellner
*Assistant Examiner*—Raymond Barrera
*Attorney, Agent, or Firm*—Oblon, Spivak, McClelland, Maier & Neustadt, P.C.

[57] ABSTRACT

The present invention provides a superconducting magnet device for a crystal pulling device comprising a pair of ring-like superconducting coils facing with each other, with the crystal pulling device disposed therebetween, a radiation shield surrounding the superconducting coils, and a vessel surrounding the radiation shield, wherein the vessel on the side facing to the crystal pulling device is made from a nonmagnetic substance, and the vessel on the other side is made from a magnetic substance.

3 Claims, 8 Drawing Sheets

SUPERCONDUCTING MAGNET DEVICE FOR CRYSTAL PULLING DEVICE

BACKGROUND OF THE INVENTION

The present invention relates to a superconducting magnet device to be used in a crystal pulling device for generating a crystal for a semiconductor device, in particular, to a superconducting magnet device for a crystal pulling device capable of reducing the leakage magnetic field.

In pulling a crystal from a molten semiconductor crystal material with a pulling device for crystals for a semiconductor, a superconducting magnet device is used as a static magnetic field generating device for preventing the movement by the heat convection by applying the static magnetic field to the molten semiconductor crystal material.

Figure 1:
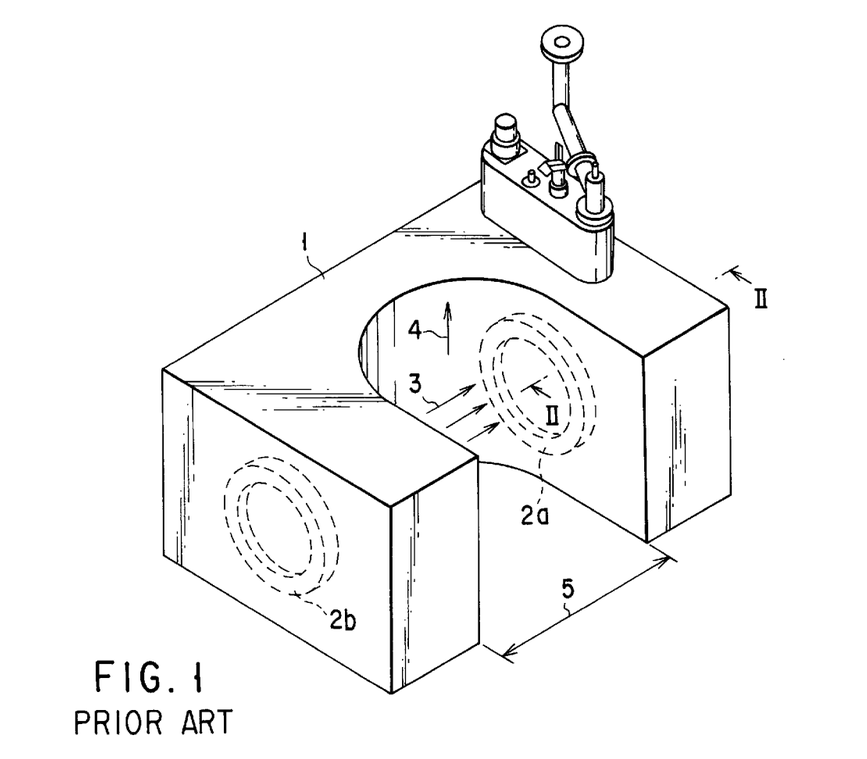
FIG. 1 is a perspective view showing a configuration of a conventional superconducting magnet device for a crystal pulling device.
Figure 2:
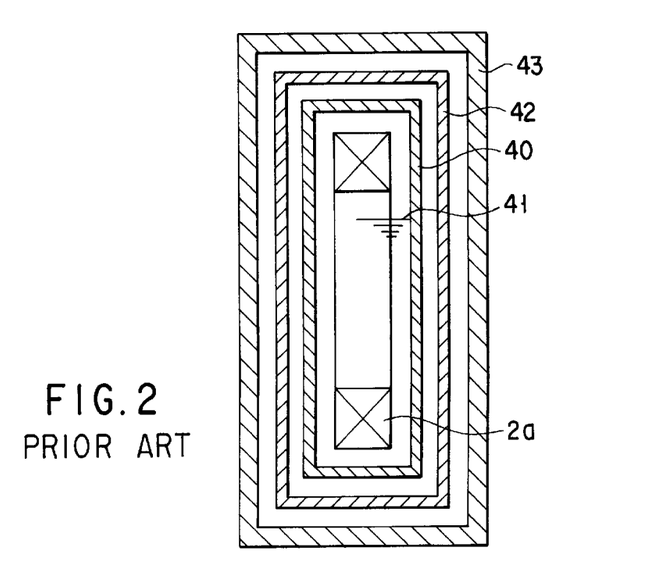
FIG. 2 is a cross-sectional view viewed from the arrow direction, taken on the line II—II of FIG. 1.

FIG. 1 is a perspective view showing a configuration of a conventional superconducting magnet device for a crystal pulling device. FIG. 2 is a cross-sectional view viewed from the direction shown by the arrows II—II of FIG. 1. As shown in FIG. 1, the superconducting magnet device is provided such that two superconducting coils 2a, 2b are arranged facing with each other in a C-shaped cryostat 1, and the magnetic field direction 3 generated by the superconducting coils 2a, 2b is orthogonal to the crystal pulling direction 4.

Furthermore, as shown in FIG. 2, the cryostat 1 has the superconducting coil 2a in a helium container 40 so that the coil 2a is soaked in a coolant 41 such as liquid helium, and the like. Moreover, a radiation shield 42 is provided outside the helium container 40, and the entirety of the helium container 40 and the radiation shield 42 is stored in a vessel 43 so as to comprise the cryostat as a whole.

Although the case provided with one radiation shield 42 is shown in the above-mentioned example, double radiation shields can be provided as needed.

Furthermore, a system where the superconducting coils 2a, 2b in the helium container 40 are cooled down to the superconducting state with a freezer without using a coolant such as liquid helium, and the like, is also be used. In this case, the helium container and the coolant shown in FIG. 2 are not provided.

This is an example of a magnetic device where a crystal pulling device is provided in the bore 5 at the center part of the C-shaped cryostat 1 for applying the horizontal magnetic field to the crystal pulling device.

Figure 3:
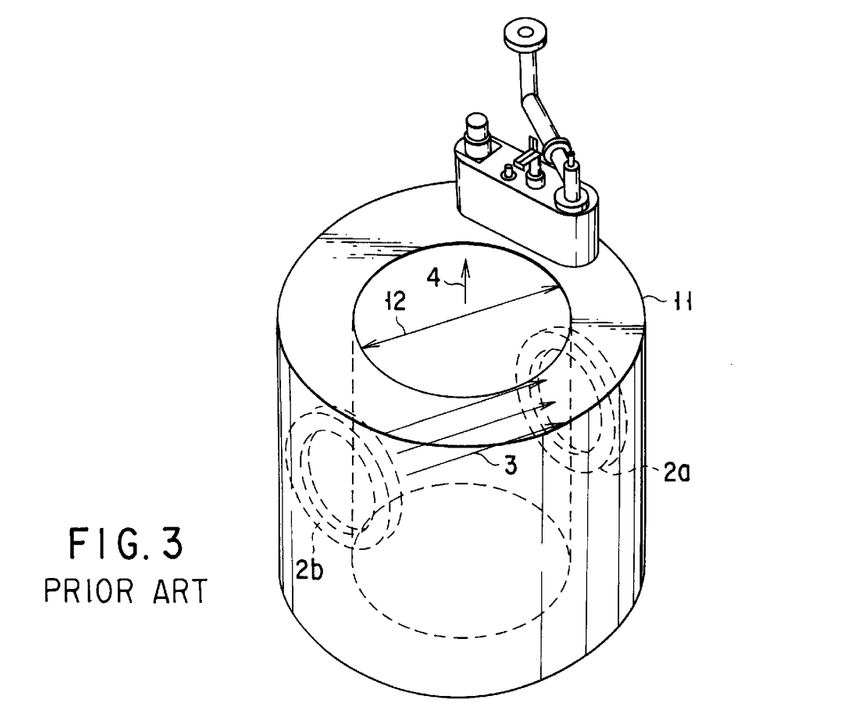
FIG. 3 shows another configuration of a conventional superconducting magnet device for a crystal pulling device.

FIG. 3 shows another configuration of a conventional superconducting magnetic device for a crystal pulling device. The superconducting magnet device is provided such that two superconducting coils 2a, 2b are provided facing with each other, and the magnetic field direction 3 generated by the superconducting coils 2a, 2b is orthogonal to the crystal pulling direction 4 as in FIG. 1 in a double-cylindrical cryostat 11 comprising the inner cylinder and the outer cylinder.

This is an example of a magnetic device where a crystal pulling device is provided in the bore 12, which is a space of room temperature, inside the inner cylinder of the cryostat 11 for applying the horizontal magnetic field to the crystal pulling device.

Figure 4:
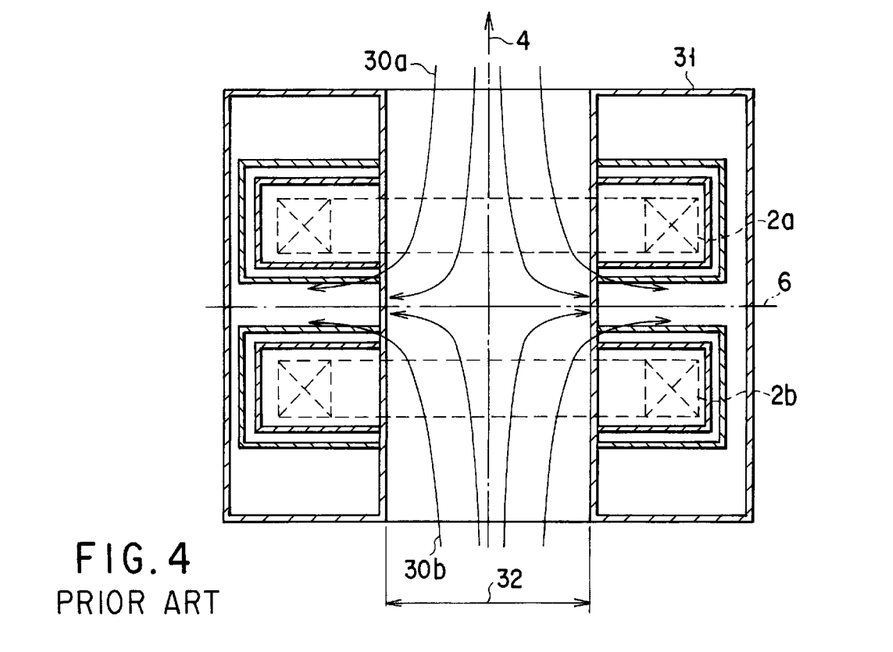
FIG. 4 shows yet another configuration of a conventional superconducting magnet device for a crystal pulling device.

FIG. 4 shows still another configuration of a conventional superconducting magnet device for a crystal pulling device. The superconducting magnet device is provided such that two superconducting coils 2a, 2b are provided facing with each other with an optional distance therebetween with respect to the axial direction of a cryostat 31 in the double-cylindrical cryostat 31 so that magnetic fields 30a, 30b are generated in the direction the coils 2a, 2b are opposed so as to generate the cusp magnetic field. In this case, the crystal pulling device is disposed in the bore 32, and the crystal pulling direction 4 is as shown in the figure. Since the magnetic field becomes zero on the line 6 in the figure in the cusp magnetic field, it is said that a high quality crystal compared with the cases of FIGS. 1 and 3 can be obtained by pulling the crystal on the line.

Since a nonmagnetic material such as stainless steel and aluminum has been used as the vessel of the cryostat in the above-mentioned conventional superconducting magnet devices for a crystal pulling device, the magnetic field generated from the superconducting coils is leaked to the outside of the magnet so as to affect a motor or component members made from a magnetic substance existing in the vicinity of the vessel. In this case, since the magnetic substance and the superconducting coils are attracted with each other and the attraction force is proportional with the volume, the weight and the magnetic field gradient of the magnetic substance, the larger the magnetic component member or the magnet are, the larger the attraction force becomes accordingly.

Therefore, it involves a problem in that the component members should be made from a nonmagnetic material, which is expensive, or the cross-section of the support in the cryostat for supporting the coils should be large, and thus the heat penetration amount of the cryostat becomes large.

Furthermore, if a motor or a measurement device easily affected by the magnetic field exists in the vicinity of the cryostat, it may lead to the malfunction of the devices.

Moreover, since the superconducting magnets adjacent to each other are affected by the leakage magnetic fields of each other if the leakage magnetic field is large so as to disturb the magnetic field strength or the magnetic field distribution necessary in the bore, the installation space of the adjacent magnets and the crystal pulling device should be wide, and thus the installation space cannot be used advantageously.

An object of the present invention is to provide a superconducting magnet device for a crystal pulling device, capable of reducing the leakage magnetic field at a comparatively low cost, and optimum for achieving the small size and the light weight.

BRIEF SUMMARY OF THE INVENTION

In order to achieve the above-mentioned object, the present invention comprises a superconducting magnet device for a crystal pulling device by the means described below.

The present invention provides a superconducting magnet device for a crystal pulling device comprising a pair of ring-like superconducting coils facing with each other, with the crystal pulling device disposed therebetween, a radiation shield surrounding the superconducting coils, and a vessel surrounding the radiation shield, wherein the vessel on the side facing to the crystal pulling device is made from a nonmagnetic substance, and the vessel on the other side is made from a magnetic substance.

Since the part of the vessel on the side facing to the crystal pulling device is made from a nonmagnetic substance conventionally used in the superconducting magnet device for a crystal pulling device according to the present invention, the magnetic field strength and the magnetic field distribution necessary for the crystal pulling device can be ensured as before, and since the other member not adjacent thereto is made from a magnetic substance, the magnetic field to be leaked can be absorbed by the magnetic substance so that the leakage magnetic field can be reduced.

In the present invention, a part of the vessel on the side facing to the crystal pulling device is made from a magnetic substance. Therefore, since a part of the vessel facing with each other is made from a magnetic substance, the leakage magnetic field on the axis of the crystal pulling device can also be reduced.

In the present invention, at least one of the magnetic materials of the vessel on the coil outer diameter side and the side opposite to the crystal pulling device with respect to the superconducting coil is thicker than the other.

Only the magnetic material closest to the superconducting coil is made thicker in the present invention. Therefore, since the thickness of a part of the vessel closer to the superconducting coil is made thicker, the leakage magnetic field can be absorbed more effectively.

The present invention provides a superconducting magnet device for a crystal pulling device comprising ring-like superconducting coils facing with each other with respect to the axial direction, ring-like radiation shields surrounding the superconducting coils, respectively, and a double cylindrical vessel surrounding the ring-like radiation shields with a space provided in the coil inner diameter part so as to dispose the crystal pulling device in the space, wherein a magnetic member projecting to at least one of the magnet inner diameter side or the outer diameter side is provided in the vessel outer diameter member at the center part of the coils. Therefore, since a larger amount of the magnetic substance is provided in the vessel on the coil symmetry plane, having the largest leakage magnetic field, a magnet with a small leakage magnetic field as a whole can be provided.

The present invention has the configuration where the magnetic substance member of the vessel comprises an aggregate of a multi-layered plates with a gap. Therefore, since the magnetic field leaked from the inner side magnetic plate can be absorbed further by the magnetic substance on the outer side owing to the multi-layered plates in the present invention, the leakage magnetic field can be further reduced.

In the present invention, either of the upper and lower coils is electrically short-circuited. Therefore, in the present invention, since either one of the main coils facing with each other is short-circuited with respect to the axial direction, by exciting the other main coil not short-circuited, the other main coil can generate the magnetic field in the opposite direction with respect to the excited main coil. That is, by exciting only one of the two coils, the short-circuit current is induced in the other coil so as to generate the magnetic field in the opposite direction (cusp magnetic field).

The present invention provides a superconducting magnet device for a crystal pulling device comprising a pair of ring-like superconducting coils facing with each other with respect to the axial direction, with the crystal pulling device disposed therebetween, a radiation shield surrounding the superconducting coils, and a vessel surrounding the radiation shield, wherein auxiliary coils for generating the magnetic field in the opposite direction with respect to that of the main coils are provided within the angle elongating from the intersection point of the symmetrical axis of the main superconducting coils and the central axis of the superconducting coils toward the main superconducting coils. Therefore, since the auxiliary coils generate the magnetic field in the opposite direction with respect to that of the main coils, the leakage magnetic field generated from the main coils can be offset by the auxiliary coils.

In the present invention, the vessel interposed between the coils facing with each other is made from a magnetic substance. Moreover, by further adding a magnetic shield to the auxiliary coils, more shield effect can be provided in the present invention.

In the present invention, the auxiliary coils are electrically short-circuited. Therefore, since the auxiliary coils induce the magnetic field in the opposite direction with respect to that of the main coils in the present invention, the magnetic shield by the auxiliary coils can be obtained only by exciting the main coils. This can be achieved by a magnet either with the lateral magnetic field, the vertical magnetic field, or the cusp magnetic field.

In the present invention, either one of the main coils facing with each other is electrically short-circuited. Therefore, in the present invention, by exciting only one main coil, the magnetic field in the opposite direction (cusp magnetic field) can be induced in the other main coil, and furthermore, the magnetic field can be generated in the auxiliary coils in the direction opposite to that of the main coils, respectively so as to obtain the magnetic shield.

Additional objects and advantages of the invention will be set forth in the description which follows, and in part will be obvious from the description, or may be learned by practice of the intention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter preferable embodiments of the present invention will be explained with reference to the accompanied drawings.

Figure 5:
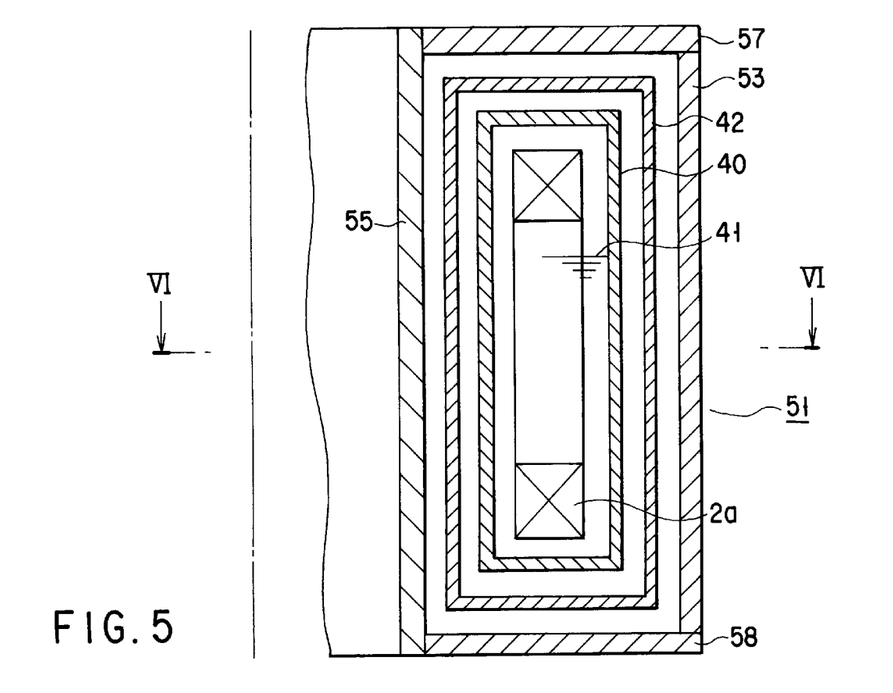
FIG. 5 is a longitudinal cross-sectional view showing a part of a first embodiment of a superconducting magnet device for a crystal pulling device according to the present invention.
Figure 6:
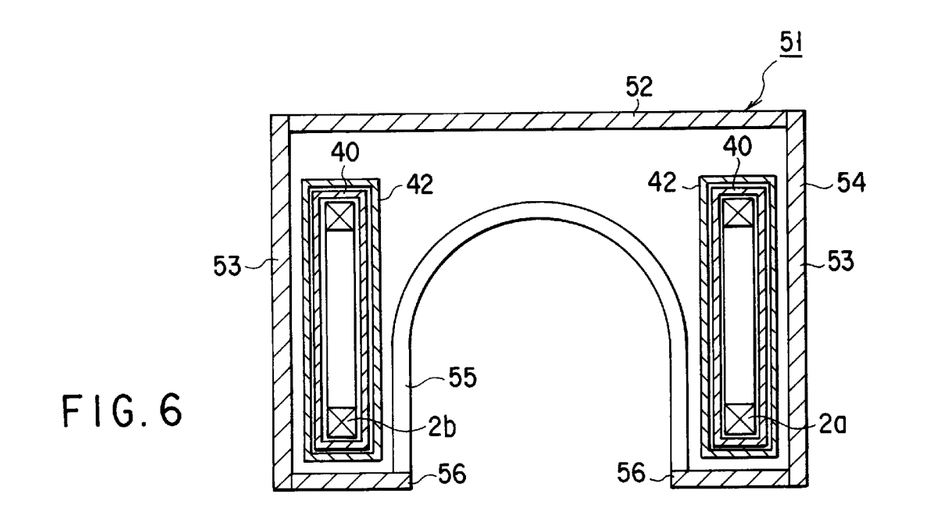
FIG. 6 is a cross-sectional view viewed from the arrow direction, taken on the line VI—VI of FIG. 5.

FIG. 5 is a longitudinal cross-sectional view showing a part of a first embodiment of a superconducting magnet device for a crystal pulling device according to the present invention, and FIG. 6 is a lateral cross-sectional view of the device as a whole.

In FIGS. 5 and 6, a vessel (e.g. a cryostat or a vacuum container) 51 comprises a frame 54 formed in a C-shape with a rear plate 52 and a pair of side plates 53, a U-shaped inner plate 55, forming the bore in the frame 54, front plates 56 for closing the spaces between the inner plate 55 and front ends of the frame 54, and an upper plate 57 and a lower plate 58 for closing the upper opening end and the lower opening end of the frame 54 and the inner plate 55.

In the vessel 51, a helium container 40 where two ring-like superconducting coils 2a, 2b (one of them, the superconducting coil 2a is shown in FIG. 5) are provided facing with each other in the direction of the central axis of the container and soaked in a coolant 41 such as liquid helium is provided, and a radiation shield 42 is provided outside the helium container 40 for surrounding the same, so as to comprise a cryostat as a whole.

In the cryostat of the first embodiment, among the component members of the vessel 51, the rear plate 52, the side plates 53, the front plates 56, the upper plate 57 and the lower plate 58 are made from a material, which is a magnetic substance, and the inner plate 55 facing to the crystal pulling device (not illustrated) to be inserted in the bore is made from a nonmagnetic material.

Therefore, according to the cryostat, since the rear plate 52, the side plates 53, the front plates 56, the upper plate 57 and the lower plate 58 comprising the vessel 50 are made from a magnetic material, and only the inner plate 55 is made from a nonmagnetic material, the magnetic field generated from the superconducting coils 2a, 2b is absorbed by the magnetic substance without leaking to the outside, and thus a motor or components made from a magnetic substance in the vicinity thereof cannot be affected.

Moreover, since the vessel 51, of which components other than the inner plate 55 comprise a magnetic substance, also serves as the magnetic shield, a small size and the light weight can be realized as a whole, and a comparatively low price can be achieved compared with the conventional one with the entirety of the vessel comprising a nonmagnetic substance.

Moreover, since a part of the magnetic field is contained by the magnetic shield, the magnetic field strength at the bore center becomes high. That is, compared with a coil without a magnetic shield, the magnetomotive force (ampere turn number) can be smaller so that a low capacity power source with a low current value can be used and a superconducting coil with a smaller number of turns can be used.

Although the case with a C-shaped frame 54 and an inner plate 55 comprising a vessel has been explained in the above-mentioned embodiment, the same effect can be obtained also in a cylindrical or cusp magnetic field shape cryostat by having the vessel member facing to the crystal pulling device made from a nonmagnetic member and the other vessel member made from a magnetic material.

Figure 7:
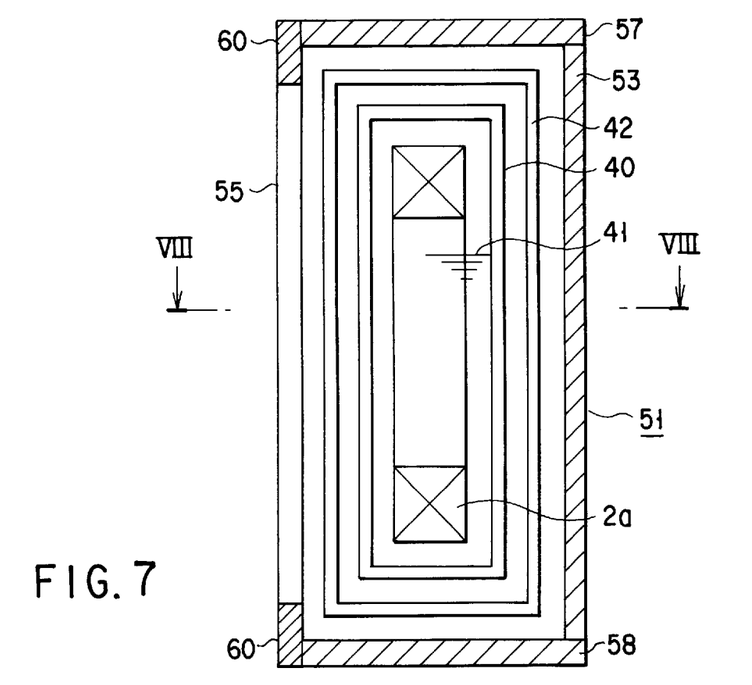
FIG. 7 is a longitudinal cross-sectional view showing a part of a second embodiment of a superconducting magnet device for a crystal pulling device according to the present invention.
Figure 8:
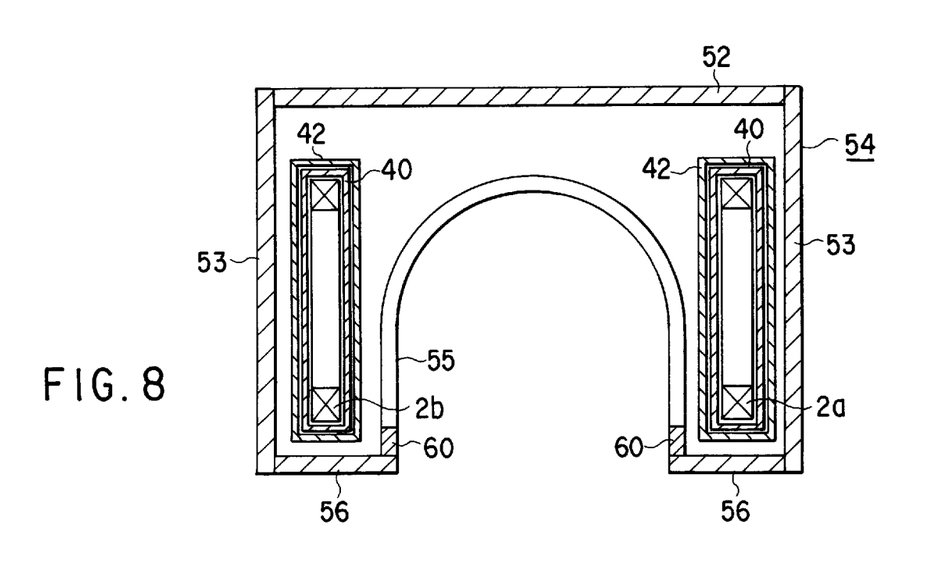
FIG. 8 is a cross-sectional view viewed from the arrow direction, taken on the line VII—VII of FIG. 7.

FIG. 7 is a longitudinal cross-sectional view showing a part of a second embodiment of a superconducting magnet device for a crystal pulling device according to the present invention, and FIG. 8 is a cross-sectional view of the entire device. For the parts the same as those of FIGS. 5 and 6, the same numerals are applied and further explanation is not given here. Only the differences will be described.

In the second embodiment, as shown in FIGS. 7 and 8, the front opening end parts of the U-shaped inner plate 55, which is a part of a component member of the vessel 51, are provided with magnetic substances 60.

Therefore, according to the cryostat, since the front opening end parts of the inner plate 55 are made from the magnetic substances 60, the line of magnetic force leaked from the inner plate side end parts of the upper plate 57 and the lower plate 58 can be absorbed to the inside so that the leakage magnetic field on the upper and lower surface of the magnet and on the crystal pulling device axis can further be reduced. Moreover, the leakage magnetic field at the opening parts of the vessel 51 can be absorbed by the magnetic substances 60 so as to be reduced.

Figure 9:
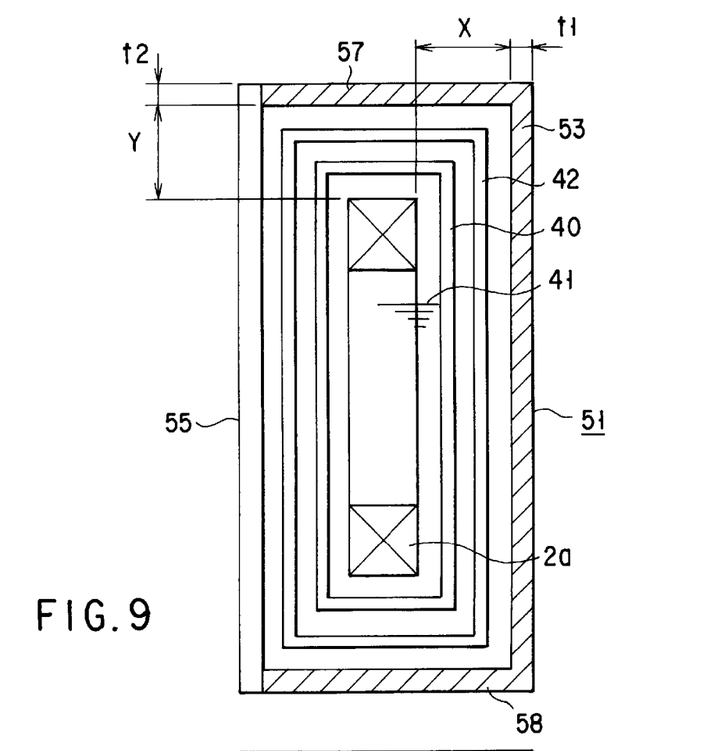
FIG. 9 is a longitudinal cross-sectional view showing a part of a third embodiment of a superconducting magnet device for a crystal pulling device according to the present invention.

FIG. 9 is a longitudinal cross-sectional view showing a part of a third embodiment of a superconducting magnet device for a crystal pulling device according to the present invention. For the parts the same as those of FIG. 5, the same numerals are applied and further explanation is not given here. Only the differences will be described.

In the third embodiment, as shown in FIG. 9, when the distance Y between the upper plate 57 of the vessel 51 and the coil 2a is shorter than the distance X between the side plate 53 and the coil 2a, the plate thickness t2 of the upper plate 57 is made thicker than the plate thickness t1 of the side plate 53.

The front plates and the rear plate, which are not illustrated, are the same as the first embodiment.

Therefore, according to the cryostat, since the thickness of the plate with a shorter distance with respect to the coil 2a is thicker than the thickness of the plate with a longer distance, the leakage magnetic field at a side closer to the coil where the magnetic field is stronger can further be absorbed. Accordingly, since all the magnetic vessel members need not be made thicker, a light weight can be achieved as a whole.

Figure 10:
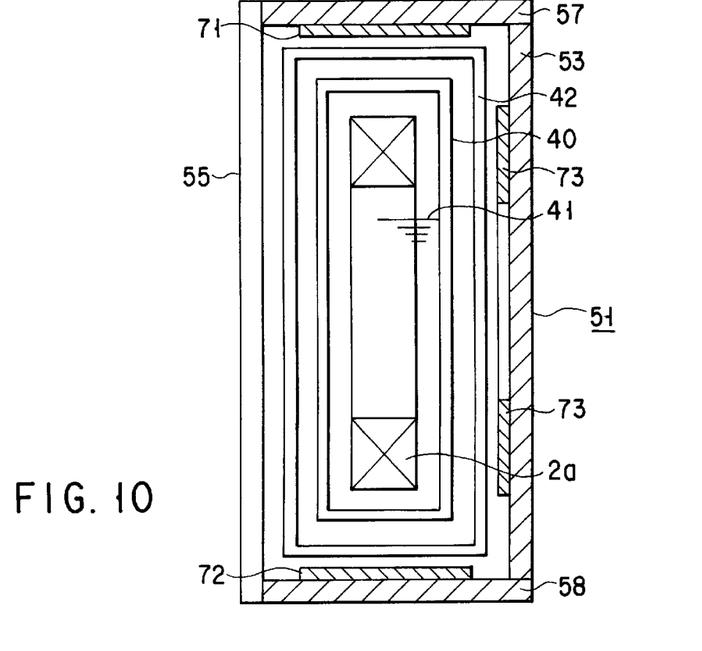
FIG. 10 is a longitudinal cross-sectional view showing a part of a fourth embodiment of a superconducting magnet device for a crystal pulling device according to the present invention.

FIG. 10 is a longitudinal cross-sectional view showing a part of a fourth embodiment of a superconducting magnet device for a crystal pulling device according to the present invention. For the parts the same as those of FIG. 5, the same numerals are applied and further explanation is not given here. Only the differences will be described.

In the fourth embodiment, as shown in FIG. 10, an upper auxiliary plate 71, a lower auxiliary plate 72 and side auxiliary plates 73 of a predetermined thickness are attached to the upper plate 57, the lower plate 58 and the inner surface of the side plates 53 corresponding to the coil, respectively. In this case, the auxiliary plates 71 to 73 are made from a magnetic material and bonded mechanically or metallurgically.

Therefore, according to the cryostat, since the leakage magnetic field in the vicinity of the coil where the magnetic field is strongest can be absorbed, the other members can be thin, and thus the light weight of the vessel can be achieved.

Although auxiliary plates are provided on the inner surface of the plates in the above-mentioned embodiment, they can be provided on the outer surface as well.

Figure 11:
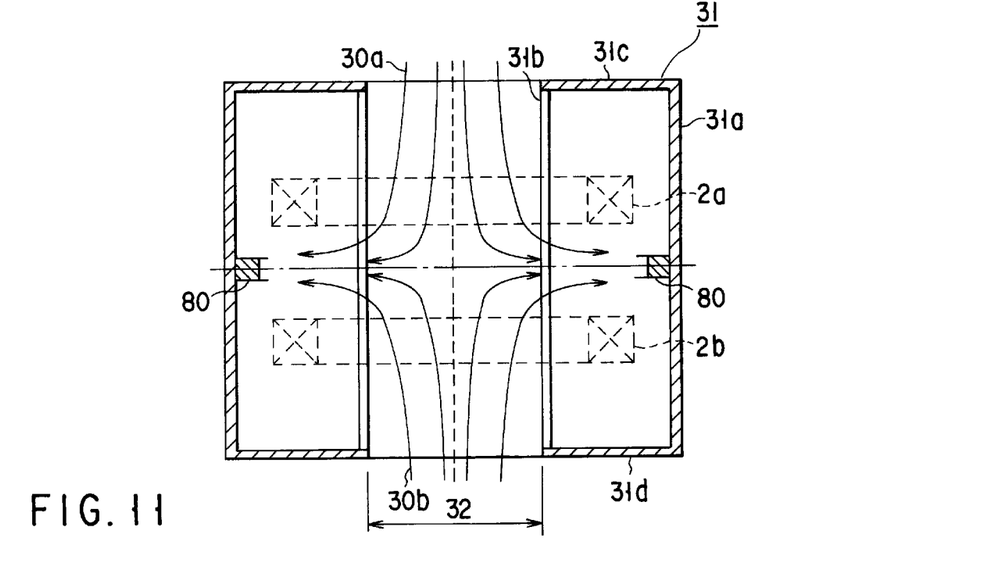
FIG. 11 is a longitudinal cross-sectional view showing a part of a fifth embodiment of a superconducting magnet device for a crystal pulling device according to the present invention.

FIG. 11 is a longitudinal cross-sectional view showing a part of a fifth embodiment of a superconducting magnet device for a crystal pulling device according to the present invention. For the parts the same as those of FIG. 4, the same numerals are applied for the explanation.

The superconducting magnet (device for a crystal pulling device shown in FIG. 11 forms a cusp magnetic field by providing two superconducting coils 2a, 2b facing with each other in the axial direction of the cryostat 31 with an appropriate distance in the double cylindrical cryostat 31 so as to generate the magnetic fields 30a, 30b in the direction toward each other as shown in FIG. 11.

In the fifth embodiment, the outer cylindrical member 31a and an upper plate 31c and a lower plate 31d to be disposed between the outer cylindrical member 31a and an inner cylindrical member 31b are made from a magnetic material (hatched parts in the figure), the inner cylindrical member 31b is made from a nonmagnetic material, and an auxiliary ring 80 made from a magnetic material is attached to the inner surface of the outer cylindrical member 31a corresponding with the part between the two superconducting coils 2a, 2b in the superconducting magnet device with such a configuration. In the figure, the numeral 32 denotes the diameter of a space part (bore), to which the crystal pulling device will be inserted.

Therefore, according to the cryostat with the configuration, since a magnetic substance is added to the surface of the outer cylindrical member 31a corresponding with the center part of the pair of the upper and lower superconducting coils 2a, 2b with respect to the axial direction, where the leakage magnetic field is large, the ability of absorbing the leakage magnetic field can further be improved and the magnetomotive force of the coils can further be lowered.

Figure 12:
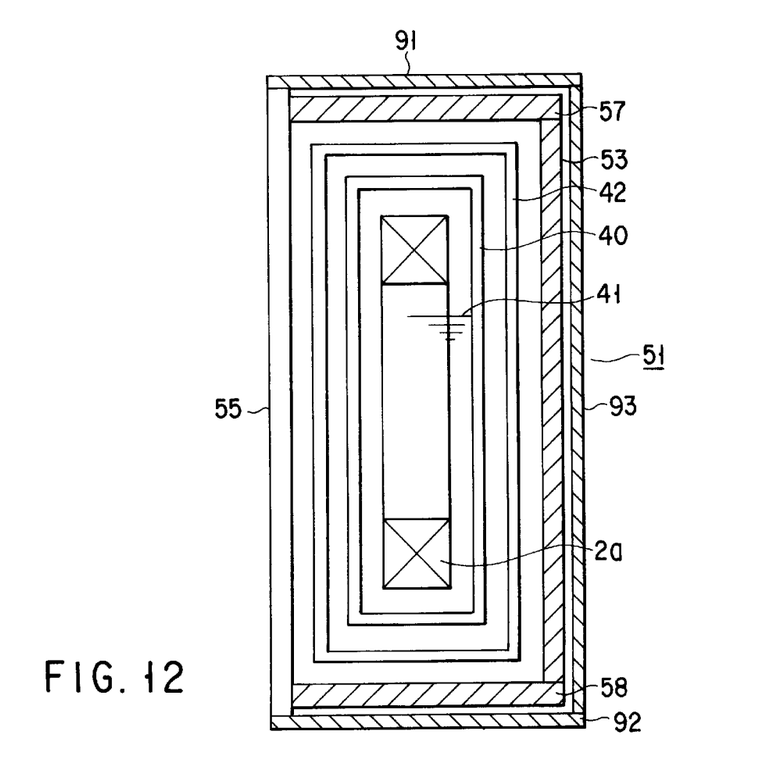
FIG. 12 is a longitudinal cross-sectional view showing a part of a sixth embodiment of a superconducting magnet device for a crystal pulling device according to the present invention.

FIG. 12 is a longitudinal cross-sectional view showing a part of a sixth embodiment of a superconducting magnet device for a crystal pulling device according to the present invention. For the parts the same as those of FIG. 5, the same numerals are applied and further explanation is not given here. Only the differences will be described.

In the sixth embodiment, as shown in FIG. 12, a rear plate (not illustrated), both side plates 53, an upper plate 57 and a lower plate 58 of a C-shaped frame comprising the vessel are covered by an upper plate 91, a lower plate 92, and an outer plate 93 made from a magnetic material and a U-shaped inner plate 55 made from a nonmagnetic material in multiple layers.

Therefore, according to the cryostat, the leakage magnetic field from the inner magnetic substance can further be reduced by the outer magnetic substance.

Figure 13:
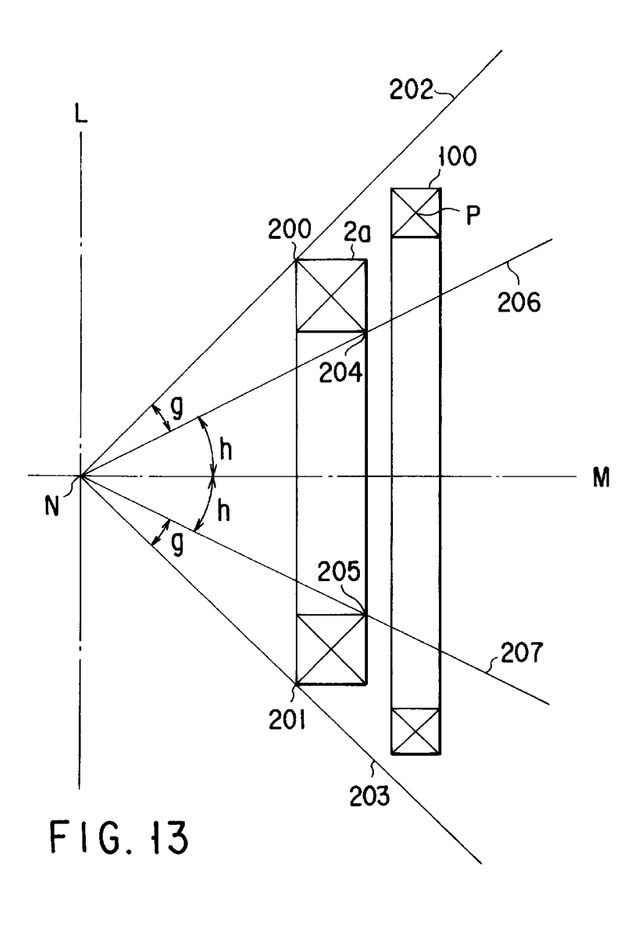
FIG. 13 shows the configuration of a coil provided in the vessel of a seventh embodiment of a superconducting magnet device for a crystal pulling device according to the present invention.

FIG. 13 shows the configuration of a coil provided in the vessel of a seventh embodiment of a superconducting magnet device for a crystal pulling device according to the present invention.

In the seventh embodiment, as shown in FIG. 13, in addition to a superconducting coil 2a, an auxiliary coil 100 having a diameter larger than that of the superconducting coil is provided so as to generate a magnetic field in the opposite direction with respect to that of the superconducting coil 2a.

In this case, if the conductor center P of the auxiliary coil exists outside the range of the angle g, formed by the lines 202, 203 linking the intersection point N of the symmetrical axis of the superconducting coil 2a and the opposing coil and the central axis M of the coil an the outer diameter part symmetrical axis side corner part 200 and the opposite side corner part 201 of the superconducting coil 2a, or the lines 206, 207 linking the intersection point N and the inner diameter part symmetrical axis side corner part 204 and the opposite side corner part 205. For example, if the conductor center P of the auxiliary coil 100 exists in the range of the angle h formed by the lines 206, 207 linking the intersection point N and the corner parts 204, 205 at the opposite side with respect to the coil inner diameter part symmetrical axis L of the superconducting coil 2a and the coil winding central axis M. It is effective for reducing the leakage magnetic field on the central axis M, but it is not effective for reducing the leakage magnetic field on the symmetrical axis L.

Furthermore, if the conductor center P of the auxiliary coil 100 exists in a range larger than the angle (g+h), it is opposite to the above-mentioned case, that is, it is effective for reducing the leakage magnetic field on the symmetrical axis L, but it is not effective for reducing the magnetic field on the central axis M.

In this embodiment, the conductor center P of the auxiliary coil 100 is provided such that it is disposed in the angle g formed by the lines elongating from the intersection point N of the symmetrical axis of the main superconducting coil 2a, to which the cross-section of the auxiliary coil 100 faces, and the coil winding central axis M toward the edges of the cross-section of the superconducting coil 2a.

Therefore, according to the cryostat provided with the coil of the above-mentioned configuration, the leakage magnetic field generated by the main coil can be offset efficiently by the auxiliary coil 100 in both outer diameter direction (symmetrical axis L direction) and central axis M direction so that an efficient magnet with a small magnetomotive force can be provided as a whole, and thus a further light weight can be achieved compared with the magnetic shield method using a magnetic substance.

Figure 14:
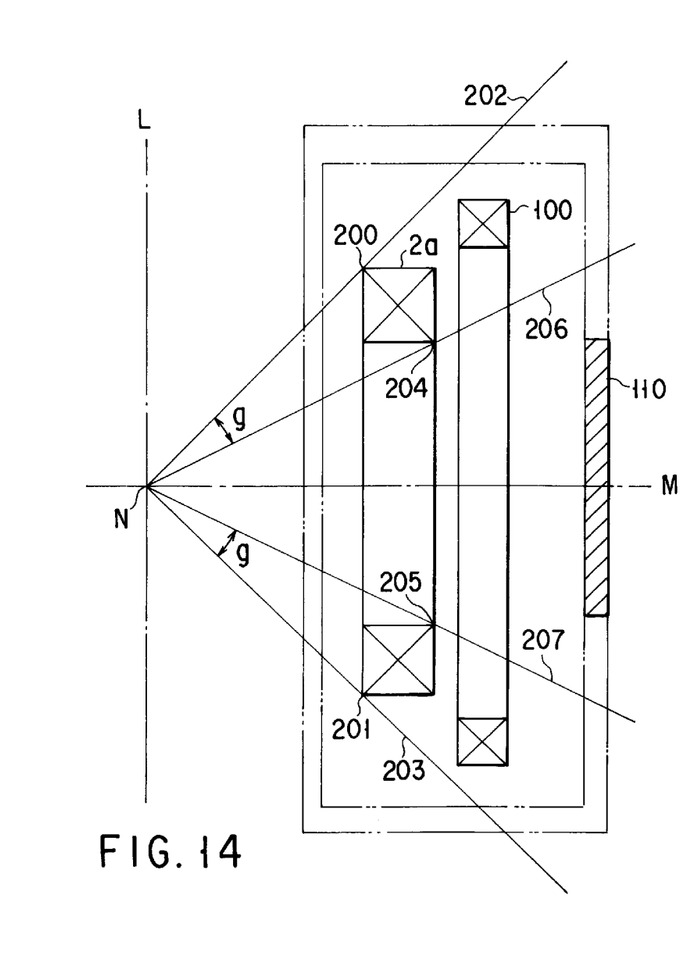
FIG. 14 shows the configuration of a coil provided in the vessel of an eighth embodiment of a superconducting magnet device for a crystal pulling device according to the present invention.

FIG. 14 shows the configuration of a coil provided in the vessel of an eighth embodiment of a superconducting magnet device for a crystal pulling device according to the present invention. For the parts the same as those of FIG. 13, the same numerals are applied and further explanation is not given here. Only the differences will be described.

In the eighth embodiment, an outer plate 110 made from a magnetic material is provided as a part of the vessel in addition to the configuration of the seventh embodiment.

Therefore, according to the cryostat with the above-mentioned configuration, the leakage magnetic field can be further reduced, and the magnetomotive force of the main coil and the auxiliary coil can be smaller. Although the outer plate made from a magnetic material is provided as a part of the vessel in the embodiment shown in the figure, the same effect can be achieved by providing it as another member other than the vessel on the inside or the outside of the vessel.

Figure 15:
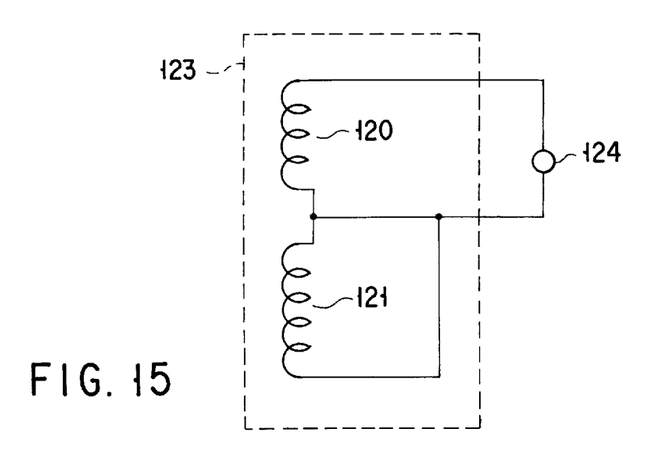
FIG. 15 shows the configuration of the connection of a coil provided in the vessel of a ninth embodiment of a superconducting magnet device for a crystal pulling device according to the present invention.

FIG. 15 shows the configuration of the connection of a coil provided in the vessel of a ninth embodiment of a superconducting magnet device for a crystal pulling device according to the present invention.

In the ninth embodiment, a pair of main coils 120, 121, provided facing with each other in a cryostat 123 are connected in series as well as the main coil 120 is connected with an exciting power source 124, and both ends of the main coil 121 are short-circuited and connected with one end of the exciting power source 124.

In the cryostat with the coil connection configuration, one main coil 120 is excited by the external exciting power source 124 so as to generate the magnetic field. At the time, electric current for generating the magnetic field with the current value the same as the main coil 120 in the opposite direction flows in the main coil 121 electrically short-circuited in the cryostat 123 according to the change by time passage of the magnetic field generated during the excitement of the main coil 120.

Therefore, by exciting only the main coil 120, the other main coil 121 is excited as well.

Since both main coils in the cryostat are connected common electrically in series in the conventional connection configuration, the inductance of the coil is larger than this embodiment, and thus a power source with a large exciting voltage is required. According to this embodiment, a low capacity power source can be used.

Figure 16:
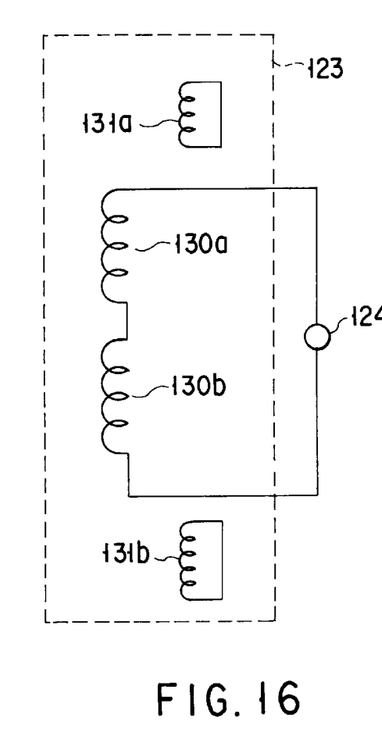
FIG. 16 shows the configuration of the connection of a coil provided in the vessel of a tenth embodiment of a superconducting magnet device for a crystal pulling device according to the present invention.

FIG. 16 shows the configuration of the connection of a coil provided in the vessel of a tenth embodiment of a superconducting magnet device for a crystal pulling device according to the present invention.

In the tenth embodiment, as shown in FIG. 16, main coils 130a, 130b, provided in a cryostat 123 are connected electrically in series as well as both ends thereof are connected with an exciting power source 124 such that the coils can generate magnetic fields in the same direction or magnetic fields in the opposite directions, and auxiliary coils 131a, 131b, with both ends short-circuited are provided, respectively.

Therefore, according to the above-mentioned configuration, since electric current for generating the magnetic field in the direction opposite to that of the main coil can be induced in the auxiliary coils 131a, 131b by exciting the main coils 130a, 130b, a power source is not required for the auxiliary coils.

Figure 17:
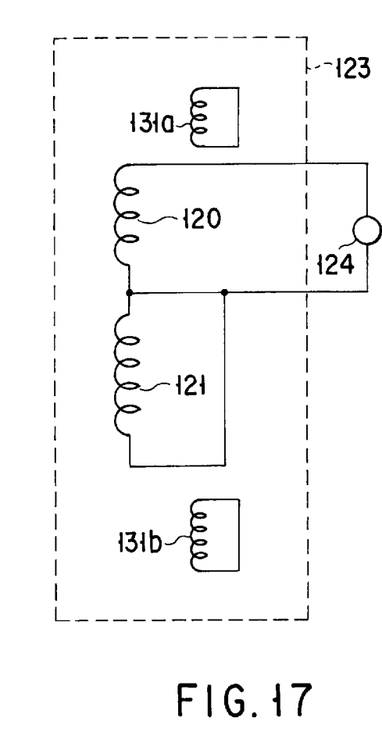
FIG. 17 shows the configuration of the connection of a coil provided in the vessel of an eleventh embodiment of a superconducting magnet device for a crystal pulling device according to the present invention.

FIG. 17 shows the configuration of the connection of a coil provided in the vessel of a eleventh embodiment of a superconducting magnet device for a crystal pulling device according to the present invention.

In the eleventh embodiment, in addition to the coil connection configuration shown in FIG. 15, auxiliary coils 131a, 131b are provided as in FIG. 16.

Therefore, according to the above-mentioned configuration, since the main coil 121 is disposed such that the coil opposes the main coil 120, the cusp magnetic field is generated, and further, the auxiliary coils 131a, 131b generate a magnetic field in the direction opposite to the magnetic field generated by each main coil, the same effect as in the ninth embodiment and the tenth embodiment can be achieved.

As heretofore mentioned, according to the superconducting magnetic device for a crystal pulling device according to the present invention, the following effects can be achieved.

(1) Since the members of the vessel facing to the crystal pulling device are a nonmagnetic member and the other members not facing thereto are a magnetic member, the magnetic field leaked to the outside can be reduced with the weight and the size the same as the conventional one. Furthermore, by having the magnetic members thicker, the magnetic shield effect can further be improved.

(2) Since the magnetic field is contained inside the vessel by the magnetic shield, and consequently the magnetic field strength of the inside becomes large, the magnetomotive force of the coil can be smaller for that. That is, a coil, can be excited by a small capacity power source can be produced with a small number of turns at a low cost.

(3) Since a part of the side facing to the crystal pulling device is made from a magnetic substance as well, the magnetic shield effect can be further improved.

(4) Since an auxiliary coil for generating the magnetic field in the opposite direction is provided in a predetermined angle, the leakage magnetic field can be reduced efficiently. Furthermore, by adding a magnetic substance thereto, a further effect can be achieved.

(5) Since the magnetic interference of magnets installed adjacent with each other can be prevented by the magnetic field, the magnetic can be installed with a smaller interval, and thus the installation space can be utilized advantageously.

(6) Since the leakage magnetic field becomes smaller, the attraction force between the magnet and the magnetic components in the vicinity thereof becomes smaller, and thus the components need not be made from a nonmagnetic substance.

(7) Since the influence on the devices provided in the vicinity of the magnet such as a motor and measurement devices, which can easily be affected by the magnetic field becomes smaller, the devices can be mounted in a position closer to the magnet compared with the conventional ones, and thus it contributes to achieving a smaller size of the pulling device as a whole.

(8) Since at least either one of the main coil and the auxiliary coil is connected electrically in the cryostat, a large magnet can be excited with a small capacity exciting power source. Moreover, by adopting such a connection, the inductance becomes smaller, and thus the excitement change and the magnetic force change can be faster thereby.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A superconducting magnet device for a crystal pulling device, comprising:

a pair of ring-like main superconducting coils facing each other with respect to the axial direction, with the crystal pulling device disposed therebetween;

a radiation shield surrounding the main superconducting coils;

a vessel surrounding the radiation shield; and auxiliary coils configured to generate a magnetic field in an opposite direction with respect to a magnetic field of the main superconducting coils;

wherein the vessel includes an outer plate made from a magnetic substance, and a conductor center of the auxiliary coils exists in a range formed by a first line and a second line;

the first line linked by an intersection point defined by a symmetrical axis and a central axis of said pair of main superconducting coils and a symmetrical axis side corner part on an outer diameter part of at least one main superconducting coil; and the second line linked by said intersection point and a corner part receded from the symmetrical axis side corner part on an inner diameter part of said at least one main superconducting coil.

2. The superconducting magnet device for a crystal pulling device according to claim 1, wherein both ends of the auxiliary coils are electrically short-circuited.

3. The superconducting magnet device for a crystal pulling device according to claim 2, wherein both ends of either one of the main superconducting coils facing each other are electrically short-circuited.

* * * * *